(12) United States Patent
Hasebe et al.

(10) Patent No.: US 9,905,328 B2
(45) Date of Patent: Feb. 27, 2018

(54) RESIN COMPOSITION FOR PRINTED WIRING BOARD MATERIAL AND PREPREG, RESIN SHEET, METAL FOIL-CLAD LAMINATE, AND PRINTED WIRING BOARD USING THE SAME

(71) Applicant: MITSUBISHI GAS CHEMICAL COMPANY, INC., Tokyo (JP)

(72) Inventors: Keiichi Hasebe, Tokyo (JP); Naoki Kashima, Tokyo (JP); Takenori Takiguchi, Tokyo (JP); Takaaki Ogashiwa, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/890,714

(22) PCT Filed: Jun. 2, 2014

(86) PCT No.: PCT/JP2014/064624
§ 371 (c)(1),
(2) Date: Nov. 12, 2015

(87) PCT Pub. No.: WO2014/196501
PCT Pub. Date: Dec. 11, 2014

(65) Prior Publication Data
US 2016/0125971 A1 May 5, 2016

(30) Foreign Application Priority Data
Jun. 3, 2013 (JP) .................................. 2013-116901

(51) Int. Cl.
| | | |
|---|---|---|
| C08L 63/00 | (2006.01) | |
| B32B 15/04 | (2006.01) | |
| B32B 27/38 | (2006.01) | |
| H01B 3/40 | (2006.01) | |
| C08J 5/24 | (2006.01) | |
| B32B 5/26 | (2006.01) | |
| C08J 5/04 | (2006.01) | |
| C08K 3/00 | (2018.01) | |
| C08K 5/3415 | (2006.01) | |
| C08K 5/544 | (2006.01) | |
| B32B 27/12 | (2006.01) | |
| B32B 27/20 | (2006.01) | |
| B32B 27/28 | (2006.01) | |
| B32B 27/34 | (2006.01) | |
| B32B 15/14 | (2006.01) | |
| H05K 1/02 | (2006.01) | |
| H05K 1/03 | (2006.01) | |

(52) U.S. Cl.
CPC ............. *H01B 3/40* (2013.01); *B32B 5/26* (2013.01); *B32B 15/04* (2013.01); *B32B 15/14* (2013.01); *B32B 27/12* (2013.01); *B32B 27/20* (2013.01); *B32B 27/281* (2013.01); *B32B 27/34* (2013.01); *B32B 27/38* (2013.01); *C08J 5/043* (2013.01); *C08J 5/24* (2013.01); *C08K 3/0033* (2013.01); *C08K 5/3415* (2013.01); *C08K 5/5442* (2013.01); *H05K 1/02* (2013.01); *B32B 2255/26* (2013.01); *B32B 2260/021* (2013.01); *B32B 2260/046* (2013.01); *B32B 2264/10* (2013.01); *B32B 2264/102* (2013.01); *B32B 2307/304* (2013.01); *B32B 2307/306* (2013.01); *B32B 2457/08* (2013.01); *C08J 2363/02* (2013.01); *H05K 1/0373* (2013.01)

(58) Field of Classification Search
None
See application file for complete search history.

(56) References Cited

U.S. PATENT DOCUMENTS

| | | | | |
|---|---|---|---|---|
| 5,258,522 A | * | 11/1993 | Tsuchida | ................. C07F 7/182 548/110 |
| 7,045,461 B2 | * | 5/2006 | Imori | ..................... C23C 18/30 427/301 |
| 2003/0088108 A1 | | 5/2003 | Kumagai et al. | |
| 2005/0277743 A1 | * | 12/2005 | Nozaki | .................. B32B 27/04 525/403 |

(Continued)

FOREIGN PATENT DOCUMENTS

| | | |
|---|---|---|
| CN | 101684127 | 3/2010 |
| JP | 2001-348393 | 12/2001 |

(Continued)

OTHER PUBLICATIONS

International Preliminary Examination Report in PCT/JP2014/064624, dated Dec. 8, 2015.

(Continued)

*Primary Examiner* — Marc S Zimmer
(74) *Attorney, Agent, or Firm* — Greenblum & Bernstein, P.L.C.

(57) ABSTRACT

A resin composition used as a material of an insulating layer of a printed wiring board including the insulating layer and a conductor layer formed on a surface of the insulating layer by plating, the resin composition including: an epoxy compound; a cyanate compound; a maleimide compound; an inorganic filler; and an imidazole silane, wherein the maleimide compound includes a predetermined maleimide compound, a content of the maleimide compound is 25% by mass or less based on 100% by mass of a total content of the epoxy compound, the cyanate compound, and the maleimide compound, and the imidazole silane includes a compound represented by the formula (3).

16 Claims, No Drawings

(56) References Cited

U.S. PATENT DOCUMENTS

| | | | | |
|---|---|---|---|---|
| 2006/0054589 A1* | 3/2006 | Omori | ................ | B32B 15/08 |
| | | | | 216/13 |
| 2006/0054859 A1* | 3/2006 | Shundo | ............ | C09K 19/14 |
| | | | | 252/299.01 |
| 2011/0244183 A1* | 10/2011 | Goto | .................. | B32B 15/08 |
| | | | | 428/145 |
| 2014/0227531 A1 | 8/2014 | Ogashiwa et al. | | |
| 2015/0034369 A1 | 2/2015 | Kashima et al. | | |
| 2015/0257277 A1* | 9/2015 | Shirahase | .......... | H05K 3/107 |
| | | | | 174/250 |

FOREIGN PATENT DOCUMENTS

| | | | |
|---|---|---|---|
| JP | 2003-318499 | | 11/2003 |
| JP | 2004-115634 A | * | 4/2004 |
| JP | 4016782 | | 12/2007 |
| JP | 4686750 | | 5/2011 |
| TW | 201309759 A1 | | 3/2013 |
| WO | WO 2012-165423 | | 6/2012 |
| WO | 2012/165423 | | 12/2012 |
| WO | 2013/008684 | | 1/2013 |

OTHER PUBLICATIONS

International Search Report issued in Patent Application No. PCT/JP2014/064624, dated Jul. 22, 2014.

* cited by examiner

RESIN COMPOSITION FOR PRINTED WIRING BOARD MATERIAL AND PREPREG, RESIN SHEET, METAL FOIL-CLAD LAMINATE, AND PRINTED WIRING BOARD USING THE SAME

TECHNICAL FIELD

The present invention relates to a resin composition useful as a material of the insulating layer of a printed wiring board, and a prepreg, a resin sheet, a metal foil-clad laminate, and a printed wiring board using such a resin composition.

BACKGROUND ART

In recent years, the miniaturization and performance enhancement of electronic equipment have advanced. For multilayer printed wiring boards, in order to improve the packaging density of electronic components, conductor wiring is increasingly made finer, and their wiring formation techniques are desired. As methods for forming high density fine wiring on an insulating layer, an additive method in which a conductor layer is formed only by electroless plating, a semi-additive method in which a thin copper layer is formed on the entire surface by electroless plating, and then a conductor layer is formed by electrolytic plating, and then the thin copper layer is flash-etched, and the like are known.

In addition, due to the miniaturization and densification of multilayer printed wiring boards, thinning laminates used for multilayer printed wiring boards is actively studied. With thinning, the problems of a decrease in packaging reliability and an increase in the warpage of multilayer printed wiring boards occur, and therefore high adhesiveness and high glass transition temperature are require of resin compositions that are materials of insulating layers.

Patent Literatures 1 and 2 describe techniques using an epoxy resin, a phenolic resin, and an imidazole silane in order to improve the adhesiveness between an inner layer circuit and an insulating layer and moldability.

In addition, Patent Literature 3 describes a resin composition using an epoxy resin, a curing agent, silica, and an imidazole silane and discloses that when this resin composition is cured, and a metal layer is formed, by plating treatment, on the surface of the cured product subsequently subjected to roughening treatment, the cured product and the metal layer exhibit high adhesion.

CITATION LIST

Patent Literature

Patent Literature 1: Japanese Patent Laid-Open No. 2003-318499
Patent Literature 2: Japanese Patent No. 4016782
Patent Literature 3: Japanese Patent No. 4686750

SUMMARY OF INVENTION

Technical Problem

However, Patent Literatures 1 and 2 describe the adhesion between an inner layer circuit and an insulating layer but do not describe at all the concepts of the adhesiveness between a conductor layer formed by plating and an insulating layer and high glass transition temperature.

In addition, the cured product described in Patent Literature 3 has excellent adhesive force between the plating metal layer on the cured product and the cured product but is not satisfactory from the viewpoint of the glass transition temperature required as the insulating layer of a printed wiring board.

The present invention has been made in view of the above problems, and it is an object of the present invention to provide a resin composition that has excellent prepreg productivity, excellent adhesiveness between an insulating layer and a conductor layer formed on the surface of the insulating layer by plating, high glass transition temperature, and also excellent heat resistance after moisture absorption when used as a material of the insulating layer of a printed wiring board, and provide a prepreg, a resin sheet, a metal foil-clad laminate, and a printed wiring board using such a resin composition.

Solution to Problem

The present inventors have obtained the finding that in a resin composition comprising an epoxy compound, a cyanate compound, a maleimide compound, an inorganic filler, and an imidazole silane, selecting the maleimide compound and the imidazole silane from particular types and setting the ratio of the maleimide compound to the total content of the epoxy compound, the cyanate compound, and the maleimide compound in a particular range provide a resin composition that has excellent adhesiveness between an insulating layer and a conductor layer formed on the surface of the insulating layer by plating, high glass transition temperature, excellent prepreg productivity, and also excellent heat resistance after moisture absorption when used as a material of the insulating layer of a printed wiring board. The present invention is based on such a finding.

Specifically, the present invention is as follows.

[1]
A resin composition used as a material of an insulating layer of a printed wiring board comprising the insulating layer and a conductor layer formed on a surface of the insulating layer by plating, the resin composition comprising:

an epoxy compound (A); a cyanate compound (B); a maleimide compound (C); an inorganic filler (D); and an imidazole silane (E), wherein the maleimide compound (C) comprises a maleimide compound represented by the following formula (1) and/or a maleimide compound represented by the following formula (2), a content of the maleimide compound (C) is 25% by mass or less based on 100% by mass of a total content of the epoxy compound (A), the cyanate compound (B), and the maleimide compound (C), and the imidazole silane (E) comprises a compound represented by the following formula (3),

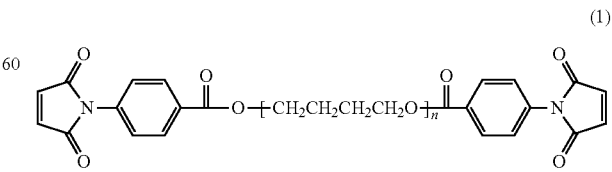

(1)

wherein n is a real number in a range of 1 to 30 as an average value, (2)

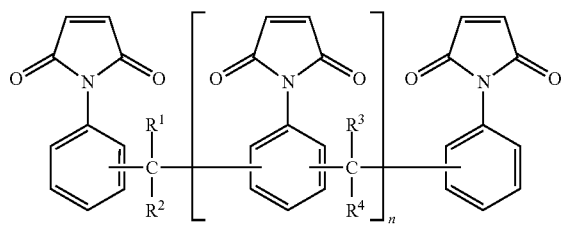

wherein $R^1$, $R^2$, $R^3$, and $R^4$ each independently represent a hydrogen atom or a methyl group, and n is a real number in a range of 1 to 10 as an average value, (3)

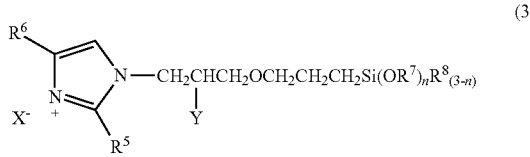

wherein $R^5$ represents hydrogen or an alkyl group having 1 to 20 carbon atoms, $R^6$ represents hydrogen, a vinyl group, or an alkyl group having 1 to 5 carbon atoms, $R^7$ and $R^8$ each independently represent an alkyl group having 1 to 3 carbon atoms, X represents an acetate ion or a phthalate ion, Y represents hydrogen or a hydroxyl group, and n represents an integer of 1 to 3.

[2]
The resin composition according to the previous section [1], wherein the cyanate compound (B) comprises a naphthol aralkyl-based cyanate compound represented by the following formula (4) and/or a novolac-based cyanate compound represented by the following formula (5), (4)

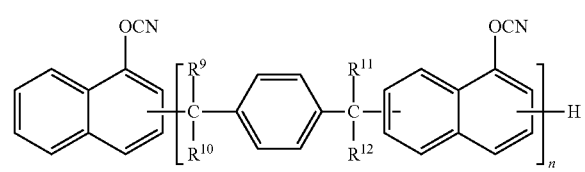

wherein $R^9$, $R^{10}$, $R^{11}$, and $R^{12}$ each independently represent a hydrogen atom or a methyl group, and n represents an integer of 1 or more, (5)

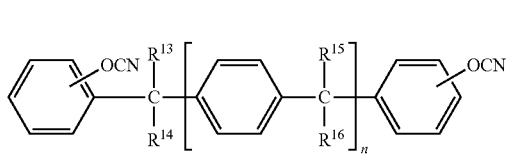

wherein $R^{13}$, $R^{14}$, $R^{15}$, and $R^{16}$ each independently represent a hydrogen atom or a methyl group, and n represents an integer of 1 or more.

[3]
The resin composition according to the previous section [1] or [2], wherein the inorganic filler (D) comprises at least one or more selected from the group consisting of silica, aluminum hydroxide, alumina, boehmite, magnesium oxide, and magnesium hydroxide.

[4]
The resin composition according to any one of the previous sections [1] to [3], wherein a content of the epoxy compound (A) is 40 to 75% by mass based on 100% by mass of the total content of the epoxy compound (A), the cyanate compound (B), and the maleimide compound (C).

[5]
The resin composition according to any one of the previous sections [1] to [4], wherein a content of the cyanate compound (B) is 20 to 40% by mass based on 100% by mass of the total content of the epoxy compound (A), the cyanate compound (B), and the maleimide compound (C).

[6]
The resin composition according to any one of the previous sections [1] to [5], wherein a content of the inorganic filler (D) is 50 to 300% by mass based on 100% by mass of the total content of the epoxy compound (A), the cyanate compound (B), and the maleimide compound (C).

[7]
The resin composition according to any one of the previous sections [1] to [6], wherein a content of the imidazole silane (E) is 0.1 to 3% by mass based on 100% by mass of the total content of the epoxy compound (A), the cyanate compound (B), and the maleimide compound (C).

[8]
A prepreg comprising a substrate and the resin composition according to any one of the previous sections [1] to [7] with which the substrate is impregnated.

[9]
A resin sheet comprising an outer layer comprising metal foil or a metal film, and a layer comprising the resin composition according to any one of the previous sections [1] to [7] laminated on the outer layer.

[10]
A metal foil-clad laminate comprising the prepreg according to the previous section [8] and metal foil laminated on one surface or both surfaces of the prepreg.

[11]
The metal foil-clad laminate according to the previous section [10], wherein the metal foil has a matte surface having a surface roughness Rz of 0.7 μm to 2.5 μm.

[12]
A printed wiring board made using the prepreg according to the previous section [8] as a buildup material.

[13]
A printed wiring board made using the resin sheet according to the previous section [9] as a buildup material.

[14]
The printed wiring board according to the previous section [13] made by surface-treating the resin sheet and forming a pattern by plating.

[15]
A printed wiring board made using the metal foil-clad laminate according to the previous section [10] as a buildup material.

[16]
The printed wiring board according to the previous section [15] made by etching the metal foil of the metal foil-clad laminate, performing surface treatment, and forming a pattern by plating.

[17]
A printed wiring board comprising an insulating layer and a conductor layer formed on a surface of the insulating layer, wherein the insulating layer comprises the resin composition according to any one of the previous sections [1] to [7].

Advantageous Effects of Invention

The resin composition of the present invention exhibits at least any, preferably all, of the following effects of (1) to (4).
(1) The prepreg productivity is excellent.
(2) The adhesiveness between an insulating layer and a conductor layer formed on the surface of the insulating layer by plating is excellent.
(3) The glass transition temperature is high.
(4) The heat resistance after moisture absorption is excellent.

DESCRIPTION OF EMBODIMENT

A mode for carrying out the present invention (hereinafter referred to as "this embodiment") will be described in detail below, but the present invention is not limited to this, and various modifications can be made without departing from the spirit thereof.
[I. Resin Composition]
A resin composition in this embodiment is
a resin composition used as a material of the insulating layer of a printed wiring board comprising the insulating layer and a conductor layer formed on the surface of the insulating layer by plating, the resin composition comprising:
an epoxy compound (A); a cyanate compound (B); a maleimide compound (C); an inorganic filler (D); and an imidazole silane (E), wherein
the maleimide compound (C) comprises a compound represented by the following formula (1) and/or a compound represented by the following formula (2),
the content of the maleimide compound (C) is 25% by mass or less based on 100% by mass of the total content of the epoxy compound (A), the cyanate compound (B), and the maleimide compound (C),
and the imidazole silane (E) comprises a compound represented by the following formula (3),

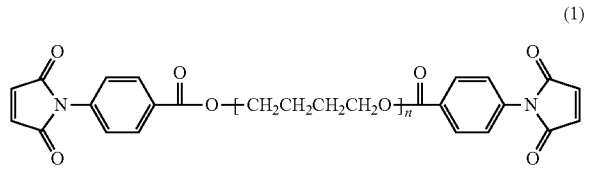

(1)

wherein n is a real number in the range of 1 to 30 as an average value,

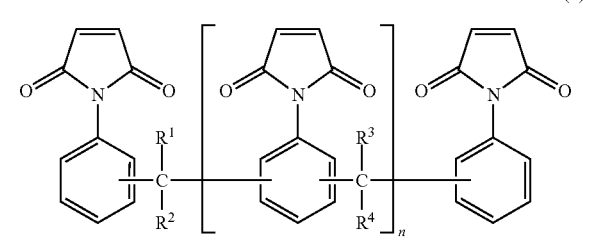

(2)

wherein $R^1$, $R^2$, $R^3$, and $R^4$ each independently represent a hydrogen atom or a methyl group, and n is a real number in the range of 1 to 10 as an average value,

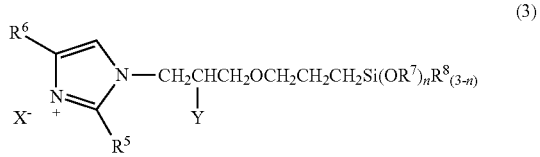

(3)

wherein $R^5$ represents hydrogen or an alkyl group having 1 to 20 carbon atoms, $R^6$ represents hydrogen, a vinyl group, or an alkyl group having 1 to 5 carbon atoms, $R^7$ and $R^8$ each independently represent an alkyl group having 1 to 3 carbon atoms, X represents an acetate ion or a phthalate ion, Y represents hydrogen or a hydroxyl group, and n represents an integer of 1 to 3.

The resin composition in this embodiment is used as a material of the insulating layer of a printed wiring board comprising the insulating layer and a conductor layer formed on the surface of the insulating layer by plating and, more specifically, is preferably used as a material of the insulating layer of a printed wiring board comprising the insulating layer and a conductor layer formed by selectively plating the surface of the insulating layer by a semi-additive method or a full additive method. The insulating layer comprising the resin composition in this embodiment has excellent adhesiveness to a conductor layer formed on the surface of the insulating layer by plating and therefore is particularly suitable for such an application.
[I-1. Epoxy Compound (A)]
The epoxy compound (A) contained in the resin composition in this embodiment is an organic compound having at least one epoxy group. The number of epoxy groups per molecule of the epoxy compound (A) is 1 or more. The number of epoxy groups is more preferably 2 or more.

The epoxy compound (A) is not particularly limited, and conventionally known epoxy resins can be used. Examples thereof include biphenyl aralkyl-based epoxy compounds (epoxy group-containing biphenyl aralkyl resins), naphthalene-based epoxy compounds (epoxy group-containing compounds having a naphthalene skeleton: naphthalene bifunctional-based epoxy compounds), bisnaphthalene-based epoxy compounds (epoxy group-containing compounds having a bisnaphthalene skeleton: naphthalene tetrafunctional-based epoxy compounds), polyfunctional phenol-based epoxy resins, naphthylene ether-based epoxy resins, phenol aralkyl-based epoxy resins, phenol novolac-based epoxy resins, cresol novolac-based epoxy resins, xylene novolac-based epoxy resins, naphthalene skeleton-modified novolac-based epoxy resins, dicyclopentadiene novolac-based epoxy resins, biphenyl novolac-based epoxy resins, phenol aralkyl novolac-based epoxy resins, naphthol aralkyl novolac-based epoxy resins, aralkyl novolac-based epoxy resins, aromatic hydrocarbon formaldehyde-based epoxy compounds (epoxy group-containing aromatic hydrocarbon formaldehyde resins), anthraquinone-based epoxy compounds (epoxy group-containing compounds having an anthraquinone skeleton), anthracene-based epoxy resins, naphthol aralkyl-based epoxy compounds (epoxy group-containing naphthol aralkyl resins), dicyclopentadiene-based epoxy resins, Xylok-based epoxy compounds (epoxy group-containing Xylok resins), bisphenol A-based epoxy resins, bisphenol E-based epoxy resins, bisphenol F-based epoxy resins, bisphenol S-based epoxy resins, bisphenol A novolac-based epoxy resins, trifunctional phenol-based epoxy compounds (epoxy group-containing compounds having a trifunctional phenol skeleton), tetrafunctional phenol-based epoxy compounds (epoxy group-containing compounds having a tetrafunctional phenol skeleton), biphenyl-based epoxy resins (epoxy group-containing compounds having a biphenyl skeleton), aralkyl novolac-based epoxy resins, triazine skeleton epoxy compounds (triazine skeleton-containing epoxy resins), triglycidyl isocyanurate, alicyclic epoxy resins, polyol-based epoxy resins, glycidyl amine, glycidyl-based ester resins, compounds obtained by epoxidizing the double bond of a double bond-containing compound such as butadiene, and compounds obtained by the reaction of a hydroxyl group-containing silicone resin and epichlorohydrin.

As described in the above illustration, an epoxy compound having a structure obtained by epoxidizing a certain resin or compound may be represented herein with the description " . . . -based epoxy compound" attached to the name of the resin or compound.

Among these, the epoxy compound (A) is preferably one or two or more selected from the group consisting of biphenyl aralkyl-based epoxy compounds, naphthalene-based epoxy compounds, bisnaphthalene-based epoxy compounds, aromatic hydrocarbon formaldehyde-based epoxy compounds, anthraquinone-based epoxy compounds, naphthol aralkyl-based epoxy compounds, and Xylok-based epoxy compounds from the viewpoint of improving the adhesiveness between the insulating layer and the plating conductor layer, flame retardancy, and the like. Preferred examples of the aromatic hydrocarbon formaldehyde-based epoxy compounds include compounds obtained by modifying with a hydroxyl group-containing aromatic hydrocarbon such as phenol or xylenol an aromatic hydrocarbon formaldehyde resin obtained by polymerizing an aromatic hydrocarbon such as benzene, toluene, or xylene with formaldehyde, and further epoxidizing the hydroxyl group, and compounds obtained by epoxidizing the hydroxyl group of an aromatic hydrocarbon formaldehyde resin obtained by polymerizing a hydroxyl group-containing aromatic hydrocarbon such as phenol or xylenol with formaldehyde.

Further, from the viewpoint of still further lowering the thermal expansion coefficient of the resin composition, the epoxy compound (A) is preferably one or two or more selected from the group consisting of biphenyl aralkyl-based epoxy resins, naphthalene-based epoxy compounds, bisnaphthalene-based epoxy compounds, and anthraquinone-based epoxy compounds.

The biphenyl aralkyl-based epoxy compounds are not particularly limited, but, for example, a compound represented by the following formula (6) is preferred. By using such a biphenyl aralkyl-based epoxy resin, the combustion resistance of the resin composition tends to be further improved.

(6)

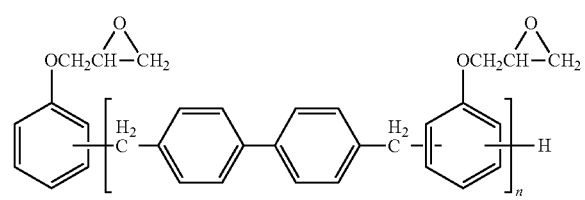

wherein n represents an integer of 1 or more; and the upper limit value of n is generally 10, preferably 7.

The content of the epoxy compound (A) is not particularly limited but is preferably 40 to 75% by mass, more preferably 50 to 70% by mass, and further preferably 60 to 70% by mass based on 100% by mass of the total content of the epoxy compound (A), the cyanate compound (B), and the maleimide compound (C) from the viewpoint of providing high glass transition temperature and good heat resistance to the insulating layer while maintaining the adhesiveness between the insulating layer and the plating conductor layer. When two or more epoxy compounds (A) are used together, the total content of these preferably satisfies the above values.

One epoxy compound (A) may be used alone, or two or more epoxy compounds (A) may be used together in any combination and ratio.

As the epoxy compound (A), ready-made products having various structures are commercially available, and they can be appropriately obtained and used. In addition, the epoxy compound (A) may be produced using a variety of known production methods. Such production methods are not particularly limited. Examples thereof include a method of obtaining or synthesizing a hydroxyl group-containing compound having the desired skeleton, and modifying the hydroxyl group by a known method for epoxidation (epoxy group introduction).

[I-2. Cyanate Compound (B)]

The cyanate compound (B) contained in the resin composition in this embodiment is a compound having a cyanato group (cyanate group). By using the cyanate compound (B), excellent properties such as chemical resistance, high glass transition temperature, and low thermal expansion properties can be provided to the resin composition.

The cyanate compound (B) is not particularly limited, and conventionally known epoxy resins can be used. Examples thereof include one or more selected from the group consisting of naphthol aralkyl-based cyanate compounds (cyanato group-containing naphthol aralkyl resins), novolac-based cyanate compounds (cyanato group-containing novolac resins), aromatic hydrocarbon formaldehyde-based cyanate compounds (cyanato group-containing aromatic hydrocarbon formaldehyde resins), and biphenyl aralkyl-based cyanate compounds (cyanato group-containing biphenyl aralkyl resins).

As described in the above illustration, the cyanate compound (B) having a structure obtained by converting a certain resin or compound into a cyanato (cyanate) may be represented herein with the description " . . . -based cyanate compound" attached to the name of the resin or compound.

Among these, as the cyanate compound (B), one or two or more selected from the group consisting of naphthol aralkyl-based cyanate compounds, novolac-based cyanate compounds, aromatic hydrocarbon formaldehyde-based cyanate compounds, and biphenyl aralkyl-based cyanate compounds are particularly preferred from the viewpoint of providing a resin composition which has excellent flame retardancy and high curability and in which the obtained cured product has high glass transition temperature. The aromatic hydrocarbon formaldehyde-based cyanate compounds are not particularly limited. Examples thereof include compounds obtained by a method of polymerizing an aromatic hydrocarbon such as benzene, toluene, or xylene with formaldehyde to obtain an aromatic hydrocarbon formaldehyde resin, modifying the obtained aromatic hydrocarbon formaldehyde resin with a hydroxyl group-containing aromatic hydrocarbon such as phenol or xylenol, and further converting the hydroxyl group into a cyanato, a method of polymerizing a hydroxyl group-containing aromatic hydrocarbon such as phenol or xylenol with formaldehyde to obtain a hydroxyl group-containing aromatic hydrocarbon formaldehyde resin, and converting the hydroxyl group of the obtained hydroxyl group-containing aromatic hydrocarbon formaldehyde resin into a cyanato, or the like.

Further, among these, naphthol aralkyl-based cyanate compounds and/or novolac-based cyanate compounds are preferred. By using naphthol aralkyl-based cyanate compounds, the curability of the resin composition tends to be still further improved, and a cured product having better flame resistance tends to be able to be obtained. In addition, by using novolac-based cyanate compounds, the heat resistance and the flame resistance tend to be further improved.

The above naphthol aralkyl-based cyanate compounds are not particularly limited, but, for example, a compound represented by the following formula (4) is preferred.

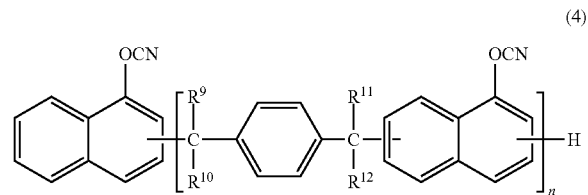

(4)

In the above formula (4), $R^9$, $R^{10}$, $R^{11}$, and $R^{12}$ each independently represent a hydrogen atom or a methyl group, and among these, a hydrogen atom is preferred. In addition, in the above formula (4), n represents an integer of 1 or more. The upper limit value of n is preferably 10, more preferably 6.

In addition, the novolac-based cyanate compounds are not particularly limited, but, for example, a compound represented by the following formula (5) is preferred.

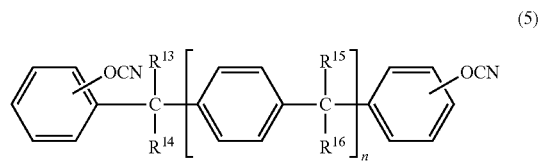

(5)

In the above formula (5), $R^{13}$, $R^{14}$, $R^{15}$, and $R^{16}$ each independently represent a hydrogen atom or a methyl group, and among these, a hydrogen atom is preferred. In addition, in the above formula (5), n represents an integer of 1 or more. The upper limit value of n is preferably 10, more preferably 7.

The content of the cyanate compound (B) in the resin composition is not particularly limited but is preferably 20 to 40% by mass, more preferably 20 to 35% by mass, based on 100% by mass of the total content of the epoxy compound (A), the cyanate compound (B), and the maleimide compound (C) from the viewpoint of providing high glass transition temperature and good heat resistance to the insulating layer. When two or more cyanate compounds (B) are used together, the total content of these preferably satisfies the above ratios.

In the resin composition in this embodiment, one cyanate compound (B) may be used alone, or two or more cyanate compounds (B) may be used together in any combination and ratio. In addition, one or two or more known cyanate compounds other than the above-described cyanate compound (B) can also be used together.

As the cyanate compound (B), ready-made products having various structures are commercially available, and they can be appropriately obtained and used. In addition, the cyanate compound (B) may be produced using a variety of known production methods. Such production methods are not particularly limited. Examples thereof include a method of obtaining or synthesizing a hydroxyl group-containing compound having the desired skeleton, and modifying the hydroxyl group by a known method for conversion into a cyanato. The method for converting a hydroxyl group into a cyanato is not particularly limited. Examples thereof include a method described in Ian Hamerton, "Chemistry and Technology of Cyanate Ester Resins," Blackie Academic & Professional.

[I-3. Maleimide Compound (C)]

The maleimide compound (C) contained in the resin composition in this embodiment comprises a maleimide compound represented by the following formula (1) and/or a maleimide compound represented by formula (2), and prepolymers of these maleimide compounds, prepolymers of these maleimide compounds and amine compounds, and the like can also be used. By using the maleimide compound represented by the following formula (1), heat resistance can be provided to the insulating layer while the adhesiveness between the insulating layer and the plating conductor layer is maintained. In addition, by using the maleimide compound represented by the following formula (2), high glass transition temperature can be provided while the adhesiveness between the insulating layer and the plating conductor layer is maintained.

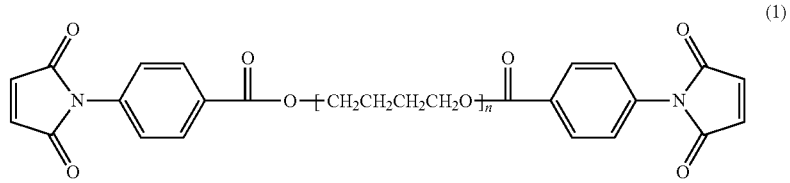

(1)

wherein n is a real number in the range of 1 to 30 as an average value.

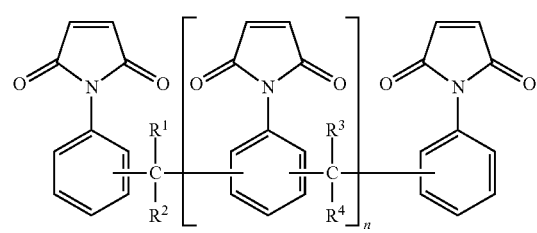

(2)

wherein $R^1$, $R^2$, $R^3$, and $R^4$ each independently represent a hydrogen atom or a methyl group, and n is a real number in the range of 1 to 10 as an average value.

The maleimide compound (C) represented by the above formula (1) is {polytetramethylene oxide-bis(4-maleimidobenzoate)}, and one or two or more maleimide compounds having different n represented by the above formula (1) can also be appropriately mixed and used. The maleimide compound (C) represented by the above formula (1) can be obtained by reacting a diamino compound represented by the following formula (7) {polytetramethylene oxide-bis(4-aminobenzoate)} with maleic anhydride. The molecular weight of the diamino compound represented by the following formula (7) usually reflects a molecular weight distribution derived from polytetramethylene glycol, a raw material, and therefore the maleimide compound (C) represented by the above formula (1) has a molecular weight distribution in a predetermined range in most cases.

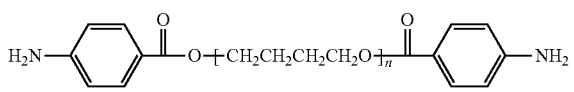

(7)

wherein n is a real number in the range of 1 to 30 as an average value.

In the above formulas (1) and (7), n is a real number in the range of 1 to 30, preferably a real number in the range of 3 to 21, and more preferably a real number in the range of 7 to 18 as an average value.

Examples of products of the maleimide compound (C) represented by formula (1) include "BMI-650P" and "BMI-1000P" manufactured by K.I Chemical Industry Co., Ltd. Examples of products of the maleimide compound (C) represented by formula (2) include "BMI-2300" manufactured by Daiwa Fine Chemicals Co., Ltd.

The content of the maleimide compound (C) is 25% by mass or less, preferably 0.10 to 25% by mass, and more preferably 3.0 to 20% by mass based on 100% by mass of the total content of the epoxy compound (A), the cyanate compound (B), and the maleimide compound (C). When the content of the maleimide compound (C) is 25% by mass or less, the interaction between the components of the resin composition, particularly the cyanate compound (B) and the particular imidazole silane (E), is further improved, and the glass transition temperature Tg of the insulating layer can also be maintained at an extremely high value (for example, 230° C. or more) while the adhesiveness between the insulating layer formed using the resin composition and the plating conductor layer is significantly improved. Thus, according to the resin composition in this embodiment, the unpredictable significant effect of achieving both excellent adhesiveness and high heat resistance at high levels can be obtained.

In the resin composition in this embodiment, one maleimide compound (C) may be used alone, or two or more maleimide compounds (C) may be used together in any combination and ratio. When two or more maleimide compounds (C) are used together, the total content of these preferably satisfies the above ratios.

[I-4. Inorganic Filler (D)]

The inorganic filler (D) contained in the resin composition in this embodiment is not particularly limited. Examples thereof include kaolin, calcined kaolin, calcined clay, uncalcined clay, silica (for example, natural silica, fused silica, amorphous silica, hollow silica, wet silica, synthetic silica, and Aerosil), aluminum compounds (for example, boehmite, aluminum hydroxide, alumina, hydrotalcite, aluminum borate, and aluminum nitride), magnesium compounds (for example, magnesium carbonate, magnesium oxide, and magnesium hydroxide), calcium compounds (for example, calcium carbonate, calcium hydroxide, calcium sulfate, calcium sulfite, and calcium borate), molybdenum compounds (for example, molybdenum oxide and zinc molybdate), talc (for example, natural talc and calcined talc), mica (isinglass), glass (for example, short fibrous glass, spherical glass, fine powder glass, and hollow glass such as A glass, NE glass, C glass, L glass, S glass, M glass G20, E glass, T glass, D glass, S glass, and Q glass), titanium oxide, zinc oxide, zirconium oxide, barium sulfate, zinc borate, barium metaborate, sodium borate, boron nitride, aggregated boron nitride, silicon nitride, carbon nitride, strontium titanate, barium titanate, stannates such as zinc stannate, and rubber-based fillers (for example, rubber powders such as styrene-based rubber powders, butadiene-based rubber powders, and acrylic-based rubber powders, core-shell-based rubber powders, silicone composite powders, silicone resin powders, and silicone rubber powders). In the resin composition in this embodiment, one inorganic filler (D) may be used alone, or two or more inorganic fillers (D) may be used together in any combination and ratio.

Among these, as the inorganic filler (D), one or two or more selected from the group consisting of silica, aluminum hydroxide, alumina, boehmite, magnesium oxide, and magnesium hydroxide are preferred. By using such an inorganic filler (D), the low thermal expansion and the flame resistance tend to be further improved.

Particularly, from the viewpoint of low thermal expansion properties, as the inorganic filler (D), silica is preferred, and fused silica is particularly preferred. Specific examples of the silica include SFP-130MC manufactured by DENKI KAGAKU KOGYO KABUSHIKI KAISHA, and SC2050-MB, SC2500-SQ, and SC4500-SQ manufactured by Admatechs Company Limited.

In addition, as the inorganic filler (D), magnesium hydroxide and/or magnesium oxide are also preferably used singly or in combination with another inorganic filler such as silica. By using magnesium hydroxide and magnesium hydroxide, the flame resistance tends to be further improved. Specific examples of the magnesium hydroxide include "ECOMAG Z-10" and "ECOMAG PZ-1" manufactured by Tateho Chemical Industries Co., Ltd., "Magseeds N," "Magseeds S," "Magseeds EP," and "Magseeds EP2-A" manufactured by Konoshima Chemical Co., Ltd., MGZ-1, MGZ-3, and MGZ-6R manufactured by Sakai Chemical Industry Co., Ltd., and "KISUMA 5," "KISUMA 5A," and "KISUMA 5P" manufactured by Kyowa Chemical Industry Co., Ltd. Specific examples of the magnesium oxide include FNM-G manufactured by Tateho Chemical Industries Co., Ltd., and SMO, SMO-0.1, and SMO-S-0.5 manufactured by Sakai Chemical Industry Co., Ltd.

The average particle diameter of the inorganic filler (D) is not particularly limited but is preferably 0.01 to 5.0 μm, more preferably 0.1 to 2.0 μm, and further preferably 0.2 to 1.5 μm from the viewpoint of prepreg productivity improvement. The "average particle diameter" of the inorganic filler (D) means the median diameter of the inorganic filler (D) herein. Here, the "median diameter" means a particle diameter such that when the particle size distribution of a powder is divided into two based on a certain particle diameter, the volume of particles on the larger particle diameter side and the volume on the smaller particle diameter side each account for 50% of the whole powder. The average particle diameter (median diameter) of the inorganic filler (D) can be measured by a wet laser diffraction-scattering method.

The content of the inorganic filler (D) in the resin composition is not particularly limited but is preferably 50 to 300% by mass, more preferably 60 to 280% by mass, and further preferably 70 to 250% by mass based on 100% by mass of the total content of the epoxy compound (A), the cyanate compound (B), and the maleimide compound (C) from the viewpoint of obtaining high plating peel strength while reducing the thermal expansion of the insulating layer. When two or more inorganic fillers (D) are used together, the total content of these preferably satisfies the above ratios.

[I-5. Imidazole Silane (E)]

The imidazole silane (E) contained in the resin composition in this embodiment comprises a compound represented by the following formula (3). By using an imidazole silane forming a salt with an acetate ion or a phthalate ion as represented by the following formula (3), the varnish gel time is relatively long, and the prepreg productivity is further improved.

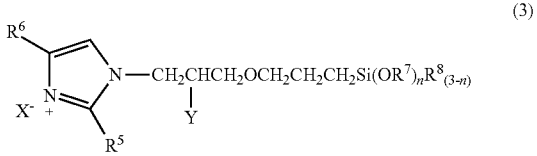

(3)

wherein $R^5$ represents hydrogen or an alkyl group having 1 to 20 carbon atoms, $R^6$ represents hydrogen, a vinyl group, or an alkyl group having 1 to 5 carbon atoms, $R^7$ and $R^8$ each independently represent an alkyl group having 1 to 3 carbon atoms, X represents an acetate ion or a phthalate ion, Y represents hydrogen or a hydroxyl group, and n represents an integer of 1 to 3.

For $R^5$, hydrogen, methyl, ethyl, undecyl, and heptadecyl are preferred particularly in terms of the ease of synthesis. In addition, for $R^6$, hydrogen, methyl, ethyl, and vinyl are preferred particularly in terms of the ease of synthesis. Further, for $R^7$, methyl and ethyl are preferred particularly in terms of the ease of synthesis, and an ethyl group is more preferred in terms of storage stability. For $R^8$, a methyl group is preferred particularly in terms of the ease of synthesis.

The method for synthesizing the compound represented by the above formula (3) is not particularly limited. Examples thereof include a method disclosed in Japanese Patent Laid-Open No. 05-186479 or Japanese Patent Laid-Open No. 09-296135. Specific examples of the imidazole silane (E) include "IA-100A," "IA-100F," and "IM-100F" manufactured by JX NIPPON MINING & METALS CORP.

In the resin composition, the imidazole silane (E) is preferably in a state of being liberated from the inorganic filler (D) without being subjected to surface treatment for the inorganic filler (D). By being in such a state, the adhesiveness between the insulating layer formed using the resin composition and the conductor layer formed on the surface of the insulating layer by plating tends to be further improved. From such a viewpoint, the imidazole silane (E) is preferably added directly to the resin composition rather than being added by a method of allowing dehydration condensation to proceed such as a dry method, a wet method, or heating and refluxing treatment.

The content of the imidazole silane (E) in the resin composition is not particularly limited but is preferably 0.05 to 3.0% by mass, more preferably 0.07 to 2.0% by mass, and further preferably 0.1 to 1.0% by mass based on 100% by mass of the total content of the epoxy compound (A), the cyanate compound (B), and the maleimide compound (C) from the viewpoint of prepreg productivity. When two or more imidazole silanes (E) are used together, the total content of these preferably satisfies the above ratios.

[I-6. Other Components]

The resin composition in this embodiment may contain one or two or more other components in addition to the epoxy compound (A), the cyanate compound (B), the maleimide compound (C), the inorganic filler (D), and the imidazole silane (E).

For example, the resin composition in this embodiment may contain a silane coupling agent for the purpose of heat resistance after moisture absorption improvement. The silane coupling agent is not particularly limited as long as it is a silane coupling agent generally used for the surface treatment of inorganic matter. Specific examples include aminosilane-based silane coupling agents (for example, γ-aminopropyltriethoxysilane and N-β-(aminoethyl)-γ-aminopropyltrimethoxysilane), epoxysilane-based silane coupling agents (for example, γ-glycidoxypropyltrimethoxysilane), vinylsilane-based silane coupling agents (for example, γ-methacryloxypropyltrimethoxysilane), cationic silane-based silane coupling agents (for example, N-β-(N-vinylbenzylaminoethyl)-γ-aminopropyltrimethoxysilane hydrochloride), and phenylsilane-based silane coupling agents. One of these silane coupling agents may be used alone, or two or more of these silane coupling agents may be used together in any combination and ratio.

When the silane coupling agent is used, its content is not particularly limited but is preferably 0.050 to 5.0% by mass, more preferably 0.10 to 3.0% by mass, based on 100% by mass of the inorganic filler (D) from the viewpoint of heat resistance after moisture absorption improvement. When two or more silane coupling agents are used together, the total content of these preferably satisfies the above ratios.

In addition, the resin composition in this embodiment may contain a wet dispersant for the purpose of prepreg productivity improvement and the like. The wet dispersant is not particularly limited as long as it is a wet dispersant generally used for a paint or the like. Specific examples include Disperbyk-110, Disperbyk-111, Disperbyk-180, Disperbyk-161, BYK-W996, BYK-W9010, and BYK-W903 manufactured by BYK Japan KK. One of these wet dispersants may be used alone, or two or more of these wet dispersants may be used together in any combination and ratio.

When the wet dispersant is used, its content is not particularly limited but is preferably 0.10 to 5.0% by mass, more preferably 0.50 to 3.0% by mass, based on 100% by mass of the inorganic filler (D) from the viewpoint of prepreg productivity improvement. When two or more wet dispersants are used together, the total content of these preferably satisfies the above ratios.

In addition, the resin composition in this embodiment may contain a curing accelerator for the purpose of the adjustment of the curing rate and the like. The curing accelerator is not particularly limited as long as it is known as a curing accelerator for an epoxy compound, a cyanate compound, or the like and generally used. Specific examples include organometallic salts comprising a metal such as copper, zinc, cobalt, nickel, or manganese (for example, zinc octylate, cobalt naphthenate, nickel octylate, and manganese octylate), imidazoles and derivatives thereof (for example, 2-ethyl-4-methylimidazole, 1-benzyl-2-phenylimidazole, and 2,4,5-triphenylimidazole), and tertiary amines (for example, triethylamine and tributylamine). One of these curing accelerators may be used alone, or two or more of these curing accelerators may be used together in any combination and ratio.

When the curing accelerator is used, its content is not particularly limited but is preferably 0.010 to 2.0% by mass, more preferably 0.10 to 1.0% by mass, based on 100% by mass of the total content of the epoxy compound (A), the cyanate compound (B), and the maleimide compound (C) from the viewpoint of obtaining high glass transition temperature. When two or more curing accelerators are used together, the total content of these preferably satisfies the above ratios.

In addition, the resin composition in this embodiment may contain a variety of other polymer compounds and/or flame-retardant compounds and the like in a range in which the expected properties are not impaired. The polymer compounds and the flame-retardant compounds are not limited as long as they are generally used. The polymer compounds are not particularly limited. Examples thereof include various thermosetting resins and thermoplastic resins and oligomers thereof, and elastomers.

The flame-retardant compounds are not particularly limited. Examples thereof include phosphorus-containing compounds (for example, phosphates, melamine phosphate, and phosphorus-containing epoxy resins), nitrogen-containing compounds (for example, melamine and benzoguanamine), oxazine ring-containing compounds, and silicone-based compounds. One of these polymer compounds and/or flame-retardant compounds may be used alone, or two or more of these polymer compounds and/or flame-retardant compounds may be used together in any combination and ratio.

In addition, the resin composition in this embodiment may contain various additives for a variety of purposes in a range in which the expected properties are not impaired. The additives are not particularly limited. Examples thereof include ultraviolet absorbing agents, antioxidants, photopolymerization initiators, fluorescent brightening agents, photosensitizers, dyes, pigments, thickening agents, lubricants, defoaming agents, dispersing agents, leveling agents, and brightening agents. One of these additives may be used alone, or two or more of these additives may be used together in any combination and ratio.

[I-7. Method for Producing Resin Composition]

The resin composition in this embodiment can be produced by mixing the above-described components, that is, the epoxy compound (A), the cyanate compound (B), the maleimide compound (C), the inorganic filler (D), the imidazole silane (E), and other components as required. The above components may be mixed in a state of a solution of the above components dissolved in an organic solvent, as required. The solution of the resin composition obtained in this manner can be preferably used as a varnish when a prepreg and a resin sheet in this embodiment described later are made.

The organic solvent is not limited as long as the above components can each be preferably dissolved or dispersed, and the expected effects of the resin composition in this embodiment are not impaired. Specific examples include alcohols (methanol, ethanol, and propanol), ketones (for example, acetone, methyl ethyl ketone, and methyl isobutyl ketone), amides (for example, dimethylacetamide and dimethylformamide), and aromatic hydrocarbons (for example, toluene and xylene). One of these organic solvents may be used alone, or two or more of these organic solvents may be used together in any combination and ratio.

The resin composition in this embodiment has excellent prepreg productivity and excellent adhesiveness between an insulating layer and a plating conductor layer when used as a material of the insulating layer of a printed wiring board. Further, an insulating layer having high glass transition temperature and further also having excellent heat resistance after moisture absorption can be provided. In addition, other preferred effects such as excellent chemical resistance can also be exhibited. In this manner, the resin composition in this embodiment has various excellent characteristics and can particularly achieve both excellent adhesiveness and high heat resistance at high levels and therefore is extremely useful as a material of the insulating layer of a printed wiring board.

[II. Prepreg, Resin Sheet, Metal Foil-Clad Laminate, and Printed Wiring Board]

The prepreg, resin sheet, metal foil-clad laminate, and printed wiring board in this embodiment are all formed using the resin composition in this embodiment described above.

[II-1. Prepreg]

The prepreg in this embodiment is a substrate impregnated with the above resin composition. As the substrate, known substrates generally used as materials of various printed wiring boards can be used. Specific examples thereof include glass fibers (for example, A glass, C glass, E glass, D glass, H glass, L glass, S glass, NE glass, T glass, Q glass, UN glass, and spherical glass), inorganic fibers (for example, inorganic fibers other than glass, such as quartz), and organic fibers (for example, polyamide-based resin fibers such as polyamide resin fibers, aromatic polyamide resin fibers, and wholly aromatic polyamide resin fibers; polyester-based resin fibers such as polyester resin fibers, aromatic polyester resin fibers, and wholly aromatic polyester resin fibers; polyimide resin fibers; and fluororesin fibers). The substrate can be appropriately selected depending on the intended application and performance.

The shape of the substrate is not particularly limited. Examples thereof include woven fabrics, nonwoven fabrics, rovings, chopped strand mats, and surfacing mats. Among these, glass fibers are preferred in terms of strength and water absorbency, and liquid crystal polyester woven fabrics are preferred in terms of electrical properties. Substrates can be used singly, or in combinations of two or more.

The thickness of the substrate is not limited but is preferably, for example, in the range of 0.01 to 0.3 mm. In terms of heat resistance after moisture absorption, glass woven fabrics subjected to surface treatment with a silane coupling agent for epoxysilane treatment, aminosilane treatment, or the like are preferred, and in terms of dimensional stability, woven fabrics subjected to ultra-opening treatment or clogging treatment are preferred.

The method for producing a prepreg by combining the resin composition with the above-described substrate is not particularly limited. Examples thereof include a method of impregnating or coating the substrate with a solution or dispersion of the resin composition dissolved or dispersed in an organic solvent (varnish) and heating the impregnated or coated substrate (for example, heating the impregnated or coated substrate in a dryer at 100 to 200° C. for 1 to 60 minutes) and/or drying the impregnated or coated substrate under reduced pressure to remove the solvent and semi-cure the resin composition to impregnate the substrate with the resin composition.

The amount of the resin composition with which the substrate is impregnated is preferably 15 to 95% by mass, more preferably 20 to 90% by mass, based on 100% by mass of the entire prepreg.

The prepreg in this embodiment can be used as a buildup material of a printed wiring board. Here, the "buildup" means making a printed wiring board having a multilayer structure by laminating prepregs or resin sheets and repeating hole making processing, wiring formation, and the like for each layer. In a printed wiring board formed using the prepreg in this embodiment, the prepreg constitutes the insulating layer. The printed wiring board will be described later.

[II-2. Resin Sheet]

The resin sheet in this embodiment comprises an outer layer comprising metal foil or a metal film, and a layer comprising the above resin composition laminated on the outer layer.

The metal foil or the metal film used as the outer layer is not particularly limited. Examples thereof include foil or films comprising a metal such as copper or aluminum. Among them, copper foil or copper films are preferred, and particularly, electrolytic copper foil, rolled copper foil, copper alloy films, and the like can be preferably used. The metal foil or the metal film may be subjected to known surface treatment, for example, nickel treatment or cobalt treatment. The thickness of the metal foil or the metal film can be appropriately adjusted depending on the use application and is preferably 5 to 70 µm.

The method for producing a resin sheet by forming a layer comprising the resin composition (resin composition layer) on an outer layer comprising the above-described metal foil or metal film is not particularly limited. Examples thereof include a method of applying (coating, impregnating, or the like), onto a surface of the above-described metal foil or film, a solution of the resin composition dissolved or dispersed in an organic solvent (varnish) and heating the painted metal foil or film and/or drying the painted metal foil or film under reduced pressure to remove the solvent and solidify the resin composition to form a resin composition layer.

The drying conditions are not particularly limited, but drying is performed so that the content of the organic solvent in the resin composition layer is preferably 10 parts by mass or less, more preferably 5.0 parts by mass or less, based on 100 parts by mass of the resin composition layer. The conditions that achieve such drying are also different depending on the amount of the organic solvent in the varnish, and, for example, in the case of a varnish comprising 30 to 60 parts by mass of an organic solvent, drying should be performed under the heating condition of 50 to 160° C. for about 3 to 10 minutes. The thickness of the resin composition layer in the resin sheet in this embodiment is not limited but is usually similar to the thickness of the outer layer (generally about 5 to 70 µm as described above), preferably 10 to 100 µm.

The resin sheet in this embodiment can also be used as a buildup material of a printed wiring board. In a printed wiring board formed using the resin sheet in this embodiment, the layer comprising the resin composition constitutes the insulating layer. The printed wiring board will be described later.

[II-3. Metal Foil-Clad Laminate]

The metal foil-clad laminate in this embodiment comprises the above prepreg and metal foil laminated on one surface or both surfaces of the prepreg. One prepreg may be used, or two or more prepregs may be laminated and used.

The method for making the metal foil-clad laminate in this embodiment is not limited. Examples thereof include a method of disposing metal foil on one surface or both surfaces of one prepreg or a laminate after laminating two or more prepregs, and performing laminate molding under conditions, for example, a temperature of 180 to 220° C., a heating time of 100 to 300 minutes, and a surface pressure of 20 to 40 kgf/cm$^2$ (about 2.0 MPa to about 3.9 MPa).

The metal foil is not particularly limited. Examples thereof include foil of metals such as copper and aluminum. Among these, copper foil is preferred. Particularly, electrolytic copper foil, rolled copper foil, and the like can be preferably used. The metal foil may be subjected to known surface treatment, for example, nickel treatment or cobalt treatment. The thickness of the metal foil can be appropriately adjusted in a range suitable as a material of a printed wiring board and is preferably 2 to 35 µm.

In addition, from the viewpoint of transferring the matte surface of the metal foil to the surface of the insulating layer (the layer comprising the prepreg) to increase adhesion to a conductor layer formed on the insulating layer by plating by the anchor effect of the irregularities transferred to the insulating layer surface, the surface roughness Rz of the matte surface of the metal foil is preferably 0.5 to 2.5 µm, more preferably 0.6 to 2.3 µm, and further preferably 0.7 to 2.0 µm. Here, the "surface roughness Rz" is an indicator representing the roughness of the matte surface of the metal foil and can be obtained by measuring by a laser microscope the roughness curve of a surface to be measured, extracting five peaks exceeding the average line in descending order and five valleys not reaching the average line in ascending order, and calculating the average value of the absolute values of the heights of the extracted peaks and the depths of the extracted valleys.

The metal foil-clad laminate in this embodiment can also be used as a buildup material of a printed wiring board. In a printed wiring board formed using the metal foil-clad laminate in this embodiment, the prepreg (the substrate and the resin composition with which the substrate is impregnated) constitutes the insulating layer. The printed wiring board will be described later.

[II-4. Printed Wiring Board]

The printed wiring board in this embodiment comprises an insulating layer and a conductor layer formed on the surface of the insulating layer, and the insulating layer comprises the above resin composition.

Such a printed wiring board can be made using as a buildup material the prepreg, the resin sheet, or the metal foil-clad laminate in this embodiment described above. In other words, by making a printed wiring board using these as a buildup material, the prepreg (the substrate and the resin composition with which the substrate is impregnated) or the resin composition layer (the layer comprising the resin composition) of the resin sheet constitutes the insulating layer comprising the resin composition.

Specifically, when the resin sheet in this embodiment is used as a buildup material, the printed wiring board in this embodiment is obtained by surface-treating the resin composition layer (insulating layer) of the resin sheet and forming a wiring pattern (conductor layer) on the insulating layer surface by plating according to an ordinary method.

When the metal foil-clad laminate in this embodiment is used as a buildup material, the printed wiring board in this embodiment can be obtained by etching the metal foil of the metal foil-clad laminate, then surface-treating the layer comprising the prepreg (insulating layer), and forming a wiring pattern (conductor layer) on the insulating layer surface by plating according to an ordinary method.

When the prepreg in this embodiment is used as a buildup material, the printed wiring board in this embodiment can be obtained by the above method after a metal foil-clad laminate is made using the prepreg by the above method for producing a metal foil-clad laminate.

Alternatively, when the prepreg in this embodiment is used as a material of a multilayer printed wiring board as described later or the like, the prepreg may be used as a buildup material as it is.

In all cases, other various steps (for example, hole drilling for forming via holes, through holes, and the like) may be added as required.

Steps for producing the printed wiring board in this embodiment will be described below.

The hole drilling is carried out for the formation of via holes, through holes, and the like. The hole drilling is performed by using any one of known methods such as an NC drill, a carbonic acid gas laser, a UV laser, a YAG laser, and plasma or combining two or more as required.

The surface treatment for the insulating layer is carried out from the viewpoint of an improvement in the adhesiveness between the insulating layer and the plating conductor layer, smear removal, and the like. The surface treatment is not particularly limited. Examples thereof include roughening treatment and silane coupling treatment. The roughening treatment can also serve as the removal of smears produced by the hole making step. In this case, the roughened state is different depending on the difference in the degree of cure of the resin composition, and therefore for the conditions of laminate molding described later, optimal conditions are preferably selected in combination with subsequent roughening treatment conditions and plating conditions.

The roughening treatment comprises a swelling step, a surface roughening and smear dissolving step, and a neutralization step.

The swelling step is performed by swelling the surface insulating layer using a swelling agent. The swelling agent is not particularly limited as long as the wettability of the surface insulating layer is improved, and the surface insulating layer can be swollen to the extent that oxidative decomposition is accelerated in the next surface roughening and smear dissolving step. Examples of the swelling agent include alkali solutions and surfactant solutions.

The surface roughening and smear dissolving step is performed using an oxidant. The oxidant is not particularly limited. Examples thereof include permanganate solutions. Preferred specific examples include potassium permanganate aqueous solutions and sodium permanganate aqueous solutions. Such oxidant treatment is referred to as wet desmear, and in addition to the wet desmear, other known roughening treatment such as dry desmear by plasma treatment or UV treatment, mechanical polishing by a buff or the like, and sandblast may be appropriately combined and carried out.

The neutralization step neutralizes the oxidant used in the previous step with a reducing agent. The reducing agent is not particularly limited. Examples thereof include amine-based reducing agents. Among these, examples of the reducing agent include acidic reducing agents such as hydroxylamine sulfate aqueous solutions, ethylenediamine tetraacetic acid aqueous solutions, and nitrilotriacetic acid aqueous solutions.

When a fine wiring pattern is formed, the surface irregularities of the insulating layer after roughening treatment are preferably small. Specifically, the Rz value is preferably 4.0 µm or less, more preferably 2.0 µm or less. The surface irregularities after roughening treatment are determined according to the degree of cure of the resin composition, the conditions of roughening treatment, and the like, and therefore optimal conditions for obtaining the desired surface irregularities are preferably selected. Particularly, the insulating layer comprising the resin composition in this embodiment can ensure adhesiveness to the plating conductor layer even if the surface roughness is low, and this insulating layer is extremely preferred.

Examples of the method for forming a wiring pattern (conductor layer) by plating include a semi-additive method, a full additive method, and a subtractive method. Among them, the semi-additive method is preferred from the viewpoint of forming a fine wiring pattern.

Examples of the method for forming a pattern by the semi-additive method include a method for forming a wiring pattern by forming a thin conductor layer on an insulating layer surface by electroless plating or the like, then selectively providing electrolytic plating (pattern plating) using a plating resist, then stripping the plating resist, and etching an appropriate amount of the whole.

Examples of the method for forming a pattern by the full additive method include a method for forming a wiring pattern by previously performing pattern formation on an insulating layer surface using a plating resist, and selectively attaching electroless plating or the like.

Examples of the method for forming a pattern by the subtractive method include a method for forming a wiring pattern by forming a conductor layer on an insulating layer surface by plating and then selectively removing the conductor layer using an etching resist.

When a wiring pattern is formed by plating, drying is preferably performed after the plating from the viewpoint of improving the adhesion strength between the insulating layer and the conductor layer. In pattern formation by the semi-additive method, electroless plating and electrolytic plating are performed in combination, and at this time, drying is preferably performed after the electroless plating and after the electrolytic plating. The drying after the electroless plating is preferably performed, for example, at 80 to 180° C. over 10 to 120 minutes, and the drying after the electrolytic plating is preferably performed, for example, at 130 to 220° C. over 10 to 120 minutes.

The printed wiring board in this embodiment can also be a multilayer printed wiring board. For example, a metal foil-clad laminate in which metal foil (for example, copper or aluminum) is disposed on both surfaces of a prepreg is formed by the above procedure, and then inner layer circuits are formed in the metal foil-clad laminate, and the obtained circuits are subjected to blackening treatment to provide an inner layer circuit board. By repeating the operation of disposing a prepreg or a resin sheet on one surface or both surfaces of the inner layer circuit board obtained in this manner or metal foil (for example, copper or aluminum) and further disposing metal foil (for example, copper or aluminum) or a release film (a film obtained by coating a surface of a polyethylene film, a polypropylene film, a polycarbonate film, a polyethylene terephthalate film, an ethylenetetrafluoroethylene copolymer film, or the like with a release agent) on the outside to perform laminate molding, a multilayer printed wiring board is produced.

The laminate molding is performed by using a method generally used for the laminate molding of an ordinary laminate for a printed wiring board, for example, a multistage press, a multistage vacuum press, a laminator, a vacuum laminator, or an autoclave molding machine, and appropriately selecting the temperature, for example, in the range of 100 to 300° C., the pressure, for example, in the range of 0.1 to 100 kgf/cm² (about 9.8 kPa to about 38 MPa), and the heating time, for example, in the range of 30 seconds to 5 hours. In addition, post-curing may be performed, for example, at a temperature of 150 to 300° C., as required, to adjust the degree of cure.

EXAMPLES

This embodiment will be described in detail below by showing a Synthesis Example, Examples, and Comparative Examples, but this embodiment is not limited to these.

1. Production of Cyanate Compound

Synthesis Example 1 Synthesis of α-Naphthol Aralkyl-Based Cyanate Compound (Compound of Formula (4a))

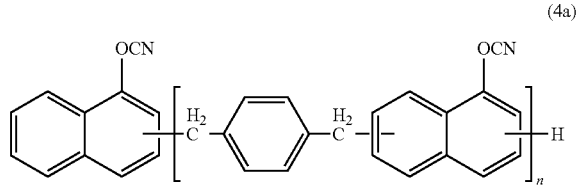

(4a)

wherein the average value of n is 3 to 4.

A reactor to which a thermometer, a stirrer, a dropping funnel, and a reflux condenser were attached was previously cooled to 0 to 5° C. with a saline solution, and the reactor was charged with 7.47 g (0.122 mol) of cyanogen chloride, 9.75 g (0.0935 mol) of 35% hydrochloric acid, 76 mL of water, and 44 mL of methylene chloride.

While the temperature in this reactor was kept at −5 to +5° C. and the pH was kept at 1 or less, a solution of 20 g (0.0935 mol) of an α-naphthol aralkyl resin represented by the following formula (4a') (SN485, OH group equivalent: 214 g/eq. softening point: 86° C., manufactured by Nippon Steel Chemical Co., Ltd.) and 14.16 g (0.14 mol) of triethylamine dissolved in 92 mL of methylene chloride was dropped through the dropping funnel under stirring over 1 hour, and after the completion of the dropping, 4.72 g (0.047 mol) of triethylamine was further dropped over 15 minutes.

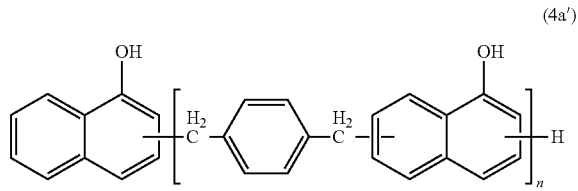

(4a')

wherein the average value of n is 3 to 4.

After the completion of the dropping, the mixture was stirred at the same temperature for 15 minutes, and then the reaction liquid was separated to isolate the organic layer. The obtained organic layer was washed twice with 100 mL of water, and then the methylene chloride was distilled off by an evaporator under reduced pressure, and finally the residue was concentrated to dryness at 80° C. for 1 hour to obtain 23.5 g of a cyanate compound of an α-naphthol aralkyl resin (α-naphthol aralkyl-based cyanate compound) represented by the above formula (4a).

2. Making of Resin Compositions and Copper-Clad Laminates

Example 1

53.3 Parts by mass (40 parts by mass in terms of nonvolatile matter) of a methyl ethyl ketone solution (hereinafter also referred to as a "MEK solution") of a biphenyl aralkyl-based epoxy compound represented by the above formula (6) (NC-3000-FH, epoxy equivalent: 320 g/eq., manufactured by Nippon Kayaku Co., Ltd.) (75% by mass of nonvolatile matter) as an epoxy compound (A), further 20 parts by mass (10 parts by mass in terms of nonvolatile matter) of a MEK solution of a naphthalene-based epoxy compound (HP4710, epoxy equivalent of 240 g/eq., manufactured by DIC Corporation) (50% by mass of nonvolatile matter) as a second epoxy compound (A), 70 parts by mass (35 parts by mass in terms of nonvolatile matter) of a methyl ethyl ketone solution of the α-naphthol aralkyl-based cyanate compound of the above formula (4a) obtained by Synthesis Example 1 (cyanate equivalent: 261 g/eq.) (50% by mass of nonvolatile matter) as a cyanate compound (B), 30 parts by mass (15 parts by mass in terms of nonvolatile matter) of a MEK solution of a maleimide compound represented by the above formula (2) (BMI-2300, manufactured by Daiwa Fine Chemicals Co., Ltd.) (50% by mass of nonvolatile matter) as a maleimide compound (C), 0.5 parts by mass (0.35 parts by mass in terms of nonvolatile matter) of an imidazole silane in which X in the above formula (3) was an acetate ion and Y was a hydroxyl group (IA-100A (70% by mass of nonvolatile matter), manufactured by JX NIPPON MINING & METALS CORP.) as an imidazole silane (E), and 50 parts by mass (0.5 parts by mass in terms of nonvolatile matter) of a propylene glycol monomethyl ether acetate solution of 2,4,5-triphenylimidazole (manufactured by Wako Pure Chemical Industries, Ltd.) (1% by mass of nonvolatile matter) and 5 parts by mass (0.05 parts by mass in terms of nonvolatile matter) of a MEK solution of manganese octylate (1% by mass of nonvolatile matter) as curing accelerators were dissolved or dispersed in MEK. Further, 100 parts by mass of silica (SFP-130MC, manufactured by DENKI KAGAKU KOGYO KABUSHIKI KAISHA, average particle diameter of 0.6 μm) as an inorganic filler (D) was added, and the mixture was stirred using a high speed stirring apparatus for 30 minutes to obtain a varnish (a solution of a resin composition comprising the epoxy compounds (A), the cyanate compound (B), the maleimide compound (C), the inorganic filler (D), and the imidazole silane (E)).

This varnish was further diluted with MEK, and an E-glass woven fabric having a thickness of 0.1 mm was impregnated with the diluted varnish and heated and dried at 160° C. for 4 minutes to obtain a prepreg having a resin composition content of 50% by mass. Four or eight of the obtained prepregs were stacked, and the matte surface of 3 μm thick electrolytic copper foil (JXUT-I, manufactured by JX NIPPON MINING & METALS CORP., surface roughness Rz=1.1 μm) was disposed on the prepreg side. Laminate molding was performed at a pressure of 40 kgf/cm² (about 3.9 MPa) and a temperature of 220° C. for 120 minutes to obtain copper-clad laminates having insulating layer thicknesses of 0.4 mm and 0.8 mm (using four and eight prepregs, respectively).

Example 2

A varnish (a solution of a resin composition) was prepared and copper-clad laminates (metal foil-clad laminates) were obtained as in Example 1 except that the amount of the imidazole silane in which X in the above formula (3) was an acetate ion and Y was a hydroxyl group (IA-100A) used as the imidazole silane (E) was changed to 3 parts by mass (2.1 parts by mass in terms of nonvolatile matter).

Example 3

A varnish (a solution of a resin composition) was prepared and copper-clad laminates (metal foil-clad laminates) were obtained as in Example 1 except that 30 parts by mass (15 parts by mass in terms of nonvolatile matter) of a MEK solution of a maleimide compound represented by the above formula (1) (BMI-1000P, manufactured by K.I Chemical Industry Co., Ltd.) (50% by mass of nonvolatile matter) instead of the maleimide compound represented by the above formula (2) (BMI-2300) was used as the maleimide compound (C).

Example 4

A varnish (a solution of a resin composition) was prepared and copper-clad laminates (metal foil-clad laminates) were obtained as in Example 1 except that the use amount of the MEK solution of the maleimide compound represented by the above formula (2) (BMI-2300) (50% by mass of nonvolatile matter) was changed to 16 parts by mass (8 parts by mass in terms of nonvolatile matter), and 14 parts by mass (7 parts by mass in terms of nonvolatile matter) of a MEK solution of the maleimide compound represented by the above formula (1) (BMI-1000P) (50% by mass of nonvolatile matter) as a second maleimide compound (C) was further added.

Example 5

A varnish (a solution of a resin composition) was prepared and copper-clad laminates (metal foil-clad laminates) were obtained as in Example 1 except that the use amount of the MEK solution of the biphenyl aralkyl-based epoxy compound represented by the above formula (6) (NC-3000-FH) (75% by mass of nonvolatile matter), the epoxy compound (A), was changed to 60 parts by mass (45 parts by mass in terms of nonvolatile matter), the amount of the MEK solution of the α-naphthol aralkyl-based cyanate compound of the above formula (4a) obtained by Synthesis Example 1 (50% by mass of nonvolatile matter) used as the cyanate compound (B) was changed to 40 parts by mass (20 parts by mass in terms of nonvolatile matter), the use amount of the MEK solution of the maleimide compound represented by the above formula (2) (BMI-2300) (50% by mass of nonvolatile matter), the maleimide compound (C), was changed to 40 parts by mass (20 parts by mass in terms of nonvolatile matter), the use amount of the imidazole silane in which X in the above formula (3) was an acetate ion and Y was a hydroxyl group (IA-100A), the imidazole silane (E), was changed to 1 part by mass (0.7 parts by mass in terms of nonvolatile matter), 10 parts by mass (5 parts by mass in terms of nonvolatile matter) of a MEK solution of the maleimide compound represented by the above formula (1) (BMI-1000P) (50% by mass of nonvolatile matter) as a second maleimide compound (C) was further added, and 50 parts by mass of silica (SC4500-SQ, manufactured by Admatechs Company Limited, average particle diameter of 1.5 μm) as a second inorganic filler (D) was further added.

Example 6

A varnish (a solution of a resin composition) was prepared and copper-clad laminates (metal foil-clad laminates) were obtained as in Example 5 except that the use amount of the silica (SC4500-SQ), the second inorganic filler (D), was changed to 200 parts by mass, and the use amount of the imidazole silane in which X in the above formula (3) was an acetate ion and Y was a hydroxyl group (IA-100A), an imidazole silane, was changed to 0.2 parts by mass (0.14 parts by mass in terms of nonvolatile matter).

Example 7

A varnish (a solution of a resin composition) was prepared and copper-clad laminates (metal foil-clad laminates) were obtained as in Example 5 except that the use amount of the MEK solution of the α-naphthol aralkyl-based cyanate compound of the above formula (4a) obtained by Synthesis Example 1 (50% by mass of nonvolatile matter), the cyanate compound (B), was changed to 80 parts by mass (40 parts by mass in terms of nonvolatile matter), the use amount of the MEK solution of the maleimide compound represented by the above formula (2) (BMI-2300) (50% by mass of nonvolatile matter), the maleimide compound (C), was changed to 10 parts by mass (5 parts by mass in terms of nonvolatile matter), the maleimide compound represented by the above formula (1) (BMI-1000P), the second maleimide compound (C), was not used, and the use amount of the imidazole silane in which X in the above formula (3) was an acetate ion and Y was a hydroxyl group (IA-100A), the imidazole silane (E), was changed to 0.5 parts by mass (0.35 parts by mass in terms of nonvolatile matter).

Example 8

A varnish (a solution of a resin composition) was prepared and copper-clad laminates (metal foil-clad laminates) were obtained as in Example 7 except that the use amount of the MEK solution of the biphenyl aralkyl-based epoxy compound represented by the above formula (6) (NC-3000-FH) (75% by mass of nonvolatile matter), the epoxy compound (A), was changed to 73.3 parts by mass (55 parts by mass in terms of nonvolatile matter), the use amount of the MEK solution of the naphthalene-based epoxy compound (HP4710) (50% by mass of nonvolatile matter), the second epoxy compound (A), was changed to 30 parts by mass (15 parts by mass in terms of nonvolatile matter), the use amount of the MEK solution of the α-naphthol aralkyl-based cyanate compound of the above formula (4a) obtained by Synthesis Example 1 (50% by mass of nonvolatile matter), the cyanate compound (B), was changed to 40 parts by mass (20 parts by mass in terms of nonvolatile matter), and the MEK solution of the maleimide compound represented by the above formula (2) (BMI-2300) (50% by mass of nonvolatile matter), the maleimide compound (C), was changed to 20 parts by mass (10 parts by mass in terms of nonvolatile matter).

Example 9

A varnish (a solution of a resin composition) was prepared and copper-clad laminates (metal foil-clad laminates) were obtained as in Example 7 except that the use amount of the MEK solution of the α-naphthol aralkyl-based cyanate compound of the above formula (4a) obtained by Synthesis Example 1 (50% by mass of nonvolatile matter), the cyanate compound (B), was changed to 70 parts by mass (35 parts by mass in terms of nonvolatile matter), and the use amount of the MEK solution of the maleimide compound represented by the above formula (2) (BMI-2300) (50% by mass of nonvolatile matter), the maleimide compound (C), was changed to 20 parts by mass (10 parts by mass in terms of nonvolatile matter).

Example 10

A varnish (a solution of a resin composition) was prepared and copper-clad laminates (metal foil-clad laminates) were obtained as in Example 9 except that 70 parts by mass (35 parts by mass in terms of nonvolatile matter) of a MEK solution of a cyanate compound represented by the following formula (5a) in which $R^{13\ to\ 16}$ in the above formula (5) were all hydrogen atoms (Primaset PT-60, manufactured by Lonza Japan Ltd.,) (50% by mass of nonvolatile matter) instead of the α-naphthol aralkyl-based cyanate compound of the above formula (4a) obtained by Synthesis Example 1 was used as the cyanate compound (B).

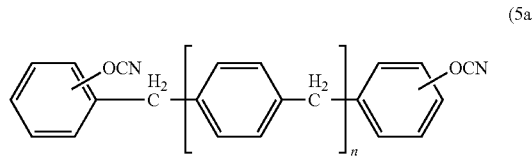

(5a)

n represents an integer of 1 or more.

Example 11

A varnish (a solution of a resin composition) was prepared and copper-clad laminates (metal foil-clad laminates) were obtained as in Example 9 except that 0.5 parts by mass (0.35 parts by mass in terms of nonvolatile matter) of an imidazole silane in which X in the above formula (3) was a phthalate ion and Y was a hydroxyl group (IA-100F, manufactured by JX NIPPON MINING & METALS CORP., 70% of nonvolatile matter) instead of the imidazole silane in which X in the above formula (3) was an acetate ion and Y was a hydroxyl group (IA-100A) was used as the imidazole silane (E).

Example 12

A varnish (a solution of a resin composition) was prepared and copper-clad laminates (metal foil-clad laminates) were obtained as in Example 9 except that 0.5 parts by mass (0.4 parts by mass in terms of nonvolatile matter) of an imidazole silane in which X in the above formula (3) was a phthalate ion and Y was hydrogen (IM-100F, manufactured by JX NIPPON MINING & METALS CORP., 80% of nonvolatile matter) instead of the imidazole silane in which X in the above formula (3) was an acetate ion and Y was a hydroxyl group (IA-100A) was used as the imidazole silane (E).

Example 13

A varnish (a solution of a resin composition) was prepared and copper-clad laminates (metal foil-clad laminates) were obtained as in Example 9 except that 100 parts by mass of magnesium hydroxide (MGZ-6R, Sakai Chemical Industry Co., Ltd., average particle diameter of 2.0 μm) instead of the silica (SFP-130MC) and the silica (SC4500-SQ) as the inorganic filler (D) was blended into the varnish.

Example 14

A varnish (a solution of a resin composition) was prepared and copper-clad laminates (metal foil-clad laminates) were obtained as in Example 13 except that 100 parts by mass of magnesium oxide (SMO-0.4, manufactured by Sakai Chemical Industry Co., Ltd., average particle diameter of 0.4 μm) instead of the magnesium hydroxide was used as the inorganic filler (D).

Example 15

A varnish (a solution of a resin composition) was prepared and copper-clad laminates (metal foil-clad laminates) were obtained as in Example 13 except that 100 parts by mass of boehmite silica (AOH-60, manufactured by Nabaltec AG, average particle diameter of 0.9 μm) instead of the magnesium hydroxide was used as the inorganic filler (D).

Comparative Example 1

A varnish (a solution of a resin composition) was prepared and copper-clad laminates (metal foil-clad laminates) were obtained as in Example 1 except that the imidazole silane in which X in the above formula (3) was an acetate ion and Y was a hydroxyl group (IA-100A) as the imidazole silane (E) was not used.

Comparative Example 2

A varnish (a solution of a resin composition) was prepared and copper-clad laminates (metal foil-clad laminates) were obtained as in Example 1 except that 1 part by mass (0.9 parts by mass in terms of nonvolatile matter) of an imidazole silane represented by the following formula (8) (IS-1000, manufactured by JX NIPPON MINING & METALS CORP., 90% by mass of nonvolatile matter) instead of the imidazole silane in which X in the above formula (3) was an acetate ion and Y was a hydroxyl group (IA-100A) was used as the imidazole silane (E).

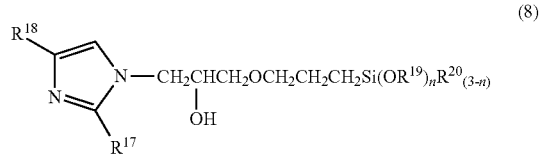

(8)

wherein $R^{17}$ represents hydrogen or an alkyl group having 1 to 20 carbon atoms, $R^{18}$ represents hydrogen, a vinyl group, or an alkyl group having 1 to 5 carbon atoms, $R^{19}$ and $R^{20}$ represent an alkyl group having 1 to 3 carbon atoms, and n represents an integer of 1 to 3.

Comparative Example 3

A varnish (a solution of a resin composition) was prepared and copper-clad laminates (metal foil-clad laminates) were obtained as in Example 1 except that 1 part by mass (0.95 parts by mass in terms of nonvolatile matter) of an imidazole silane represented by the following formula (9) (IM-1000, manufactured by JX NIPPON MINING & METALS CORP., 95% by mass of nonvolatile matter) instead of the imidazole silane in which X in the above formula (3) was an acetate ion and Y was a hydroxyl group (IA-100A) was used as the imidazole silane (E).

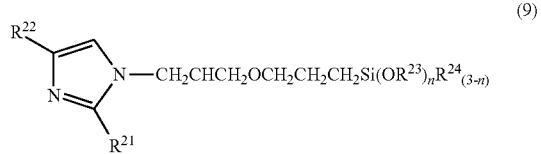

(9)

wherein $R^{21}$ represents hydrogen or an alkyl group having 1 to 20 carbon atoms, $R^{22}$ represents hydrogen, a vinyl group, or an alkyl group having 1 to 5 carbon atoms, $R^{23}$ and $R^{24}$ represent an alkyl group having 1 to 3 carbon atoms, and n represents an integer of 1 to 3.

Comparative Example 4

A varnish (a solution of a resin composition) was prepared and copper-clad laminates (metal foil-clad laminates) were obtained as in Example 1 except that 30 parts by mass (15 parts by mass in terms of nonvolatile matter) of a MEK solution of bis(3-ethyl-5-methyl-4 maleimidophenyl)methane (BMI-70, manufactured by K.I Chemical Industry Co., Ltd.) (50% by mass of nonvolatile matter) instead of the maleimide compound represented by the above formula (2) (BMI-2300) was used as the maleimide compound (C).

Comparative Example 5

A varnish (a solution of a resin composition) was prepared and copper-clad laminates (metal foil-clad laminates) were obtained as in Example 1 except that 70 parts by mass (35 parts by mass in terms of nonvolatile matter) of a MEK solution of a naphthol aralkyl-based phenolic resin (SN495V2 (SN—OH), phenol equivalent of 236 g/eq., manufactured by Nippon Steel Chemical Co., Ltd.) (50% by mass of nonvolatile matter) instead of the α-naphthol aralkyl-based cyanate compound of the above formula (4a) obtained by Synthesis Example 1 was used.

Comparative Example 6

A varnish (a solution of a resin composition) was prepared and copper-clad laminates (metal foil-clad laminates) were obtained as in Example 9 except that the use amount of the MEK solution of the biphenyl aralkyl-based epoxy compound represented by the above formula (6) (NC-3000-FH) (75% by mass of nonvolatile matter), the epoxy compound (A), was changed to 35.7 parts by mass (25 parts by mass in terms of nonvolatile matter), the amount of the MEK solution of the naphthalene-based epoxy compound (HP4710) (50% by mass of nonvolatile matter), the second epoxy compound (A), used was further changed to 10 parts by mass (5 parts by mass in terms of nonvolatile matter), and the use amount of the MEK solution of the maleimide compound represented by the above formula (2) (BMI-2300) (50% by mass of nonvolatile matter), the maleimide compound (C), was changed to 70 parts by mass (35 parts by mass in terms of nonvolatile matter).

3. Evaluation of Resin Compositions

Wet Roughening Treatment of Copper-Clad Laminates and Conductor Layer Plating:

The surface layer copper foil of the copper-clad laminates having insulating layer thicknesses of 0.4 mm and 0.8 mm (using four and eight prepregs, respectively) obtained in Examples 1 to 15 and Comparative Examples 1 to 6 was removed by etching. Electroless copper plating of about 0.5 μm was provided by the process of electroless copper plating manufactured by C. Uyemura & Co., Ltd. (names of chemical solutions used: MCD-PL, MDP-2, MAT-SP, MAB-4-C, MEL-3-APEA ver. 2), and drying was performed at 130° C. for 1 hour. Next, electrolytic copper plating was provided so that the thickness of plating copper was 18 μm, and drying was performed at 180° C. for 1 hour. In this manner, circuit wiring board samples in which conductor layers (plating copper) having a thickness of 18 μm were formed on insulating layers having thicknesses of 0.4 mm and 0.8 mm were made and subjected to the following evaluation.

Evaluation Methods:

(1) Rate of Change in Varnish Gel Time

A varnish was placed on a hot plate at 170° C., and the time until the varnish cured (varnish gel time) was measured. The varnish gel time on the day of varnish making and the varnish gel time when the varnish was stored at 30° C. for 2 days were measured. The amount of change in varnish gel time was obtained by numerical formula (1) below and evaluated according to the following evaluation criteria. The results are shown in Tables 1 to 3.

the amount of change in varnish gel time (%)=varnish gel time 2 days after varnish making/varnish gel time on the day of varnish making× 100.   Numerical formula (1):

Good: the amount of change in varnish gel time was 75% to 100%.

Fair: the amount of change in varnish gel time was 50% to 74%.

Poor: the amount of change in varnish gel time was 49% or less.

(2) Plating Copper Peel Strength:

The circuit wiring board samples having an insulating layer thickness of 0.4 mm made by the above procedure were used. The plating copper peel strength (adhesive force) was measured three times according to JISC6481, and the average value of the plating copper peel strength was obtained. For the samples swollen by the drying after the electrolytic copper plating, evaluation was performed using the portion not swollen. The results are shown in Tables 1 to 3.

(3) Glass Transition Temperature:

The circuit wiring board samples having an insulating layer thickness of 0.8 mm made by the above procedure were used. The surface layer copper foil of the circuit wiring board sample was removed by etching. The temperature was increased by 10° C. per minute from 40° C. to 300° C. by a thermomechanical analysis apparatus (Q800 manufactured by TA Instruments), and the glass transition temperature was measured. The results are shown in Tables 1 to 3.

(4) Heat Resistance after Moisture Absorption:

The circuit wiring board samples having an insulating layer thickness of 0.4 mm made by the above procedure were used. The circuit wiring board sample was cut into a 50 mm×50 mm square, and then the plating copper except half of the plating copper on one surface was removed by etching to make a sample. The sample was treated at 121° C. and 2 atmospheres by a pressure cooker tester (PC-3 model manufactured by HIRAYAMA MANUFACTURING CORPORATION) for 1, 3, and 5 hours and then immersed in a solder bath at 260° C. for 60 seconds, and the presence or absence of abnormality in appearance change was visually observed. Three samples were tested, and for each sample, one without abnormality was described as "Good," and one in which swelling occurred was described as "No." The results are shown in Tables 1 to 3. In the tables, "PCT-1H," "PCT-3H," and "PCT-5H" show the results obtained after the treatment by the pressure cooker tester for 1, 3, and 5 hours, respectively.

TABLE 1

| Evaluation results | | Example 1 | Example 2 | Example 3 | Example 4 | Example 5 | Example 6 | Example 7 | Example 8 |
|---|---|---|---|---|---|---|---|---|---|
| Amount of change in varnish gel time (%) | | Good | Fair | Good | Good | Good | Good | Good | Good |
| Plating copper peel strength (kg/cm) | | 0.83 | 0.85 | 0.9 | 0.85 | 0.82 | 0.78 | 0.75 | 0.9 |
| Glass transition temperature DMA (° C.) | | 270 | 270 | 240 | 255 | 250 | 250 | 260 | 240 |
| Heat resistance after moisture absorption | PCT-1H | Good | Good | Good | Good | Good | Good | Good | Good |
| | | Good | Good | Good | Good | Good | Good | Good | Good |
| | | Good | Good | Good | Good | Good | Good | Good | Good |
| | PCT-3H | Good | Good | Good | Good | Good | Good | Good | Good |
| | | Good | Good | Good | Good | Good | Good | Good | Good |
| | | Good | Good | Good | Good | Good | Good | Good | Good |
| | PCT-5H | Good | Good | Good | Good | Good | Good | Good | Good |
| | | Good | Good | Good | Good | Good | Good | Good | Good |
| | | Good | Good | Good | Good | Good | Good | Good | Good |

*DMA: dynamic viscoelasticity measurement

TABLE 2

| Evaluation results | | Example 9 | Example 10 | Example 11 | Example 12 | Example 13 | Example 14 | Example 15 |
|---|---|---|---|---|---|---|---|---|
| Amount of change in varnish gel time (%) | | Good | Good | Good | Good | Good | Good | Good |
| Plating copper peel strength (kg/cm) | | 0.8 | 0.7 | 0.8 | 0.81 | 0.85 | 0.85 | 0.85 |
| Glass transition temperature DMA (° C.) | | 265 | 275 | 270 | 270 | 270 | 270 | 270 |
| Heat resistance after moisture absorption | PCT-1H | Good | Good | Good | Good | Good | Good | Good |
| | | Good | Good | Good | Good | Good | Good | Good |
| | | Good | Good | Good | Good | Good | Good | Good |
| | PCT-3H | Good | Good | Good | Good | Good | Good | Good |
| | | Good | Good | Good | Good | Good | Good | Good |
| | | Good | Good | Good | Good | Good | Good | Good |
| | PCT-5H | Good | Good | Good | Good | Good | Good | Good |
| | | Good | Good | Good | Good | Good | Good | Good |
| | | Good | Good | Good | Good | Good | Good | Good |

*DMA: dynamic viscoelasticity measurement

TABLE 3

| Evaluation results | Comparative Example 1 | Comparative Example 2 | Comparative Example 3 | Comparative Example 4 | Comparative Example 5 | Comparative Example 6 |
|---|---|---|---|---|---|---|
| Amount of change in varnish gel time (%) | Good | Poor | Poor | Good | Good | Good |
| Plating copper peel strength (kg/cm) | 0.6 | 0.6 | 0.55 | 0.5 | 0.7 | 0.45 |
| Glass transition temperature DMA (° C.) | 270 | 270 | 270 | 270 | 220 | 285 |

TABLE 3-continued

| Evaluation results | | Comparative Example 1 | Comparative Example 2 | Comparative Example 3 | Comparative Example 4 | Comparative Example 5 | Comparative Example 6 |
|---|---|---|---|---|---|---|---|
| Heat resistance after moisture absorption | PCT-1H | Good | Good | Good | Good | Good | Good |
| | | Good | Good | Good | Good | Good | Good |
| | | Good | Good | Good | Good | Good | Good |
| | PCT-3H | Good | Good | Good | Good | Good | Good |
| | | Good | Good | Good | Good | Good | Good |
| | | Good | No | Good | Good | No | Good |
| | PCT-5H | Good | Good | Good | Good | No | Good |
| | | Good | No | Good | Good | No | Good |
| | | Good | No | Good | Good | No | Good |

*DMA: dynamic viscoelasticity measurement

From Tables 1 to 3, it is seen that Examples 1 to 15 having the insulating layers formed using the resin compositions of the present invention have higher plating peel strength and glass transition temperature and also better heat resistance after moisture absorption than Comparative Examples 1 to 6. In addition, in Comparative Examples 2 and 3, the amount of change in varnish gel time was small, and it was difficult to stably produce the prepreg.

This application is based on Japanese Patent Application No. 2013-116901 filed with the Japan Patent Office on Jun. 3, 2013, the contents of which are incorporated herein by reference.

INDUSTRIAL APPLICABILITY

The resin composition of the present invention exhibits various effects such as excellent prepreg productivity and excellent adhesiveness between an insulating layer and a plating conductor layer and also excellent heat resistance when used as a material of the insulating layer of a printed wiring board as described above, and therefore the resin composition of the present invention is extremely useful as a material of the insulating layer of a printed wiring board.

The invention claimed is:

1. A resin composition used as a material of an insulating layer of a printed wiring board comprising the insulating layer and a conductor layer formed on a surface of the insulating layer by plating, the resin composition comprising:

an epoxy compound (A); a cyanate compound (B); a maleimide compound (C); an inorganic filler (D); and an imidazole silane (E), wherein the maleimide compound (C) comprises a maleimide compound represented by the following formula (1) and/or a maleimide compound represented by the following formula (2), a content of the maleimide compound (C) is 25% by mass or less based on 100% by mass of a total content of the epoxy compound (A), the cyanate compound (B), and the maleimide compound (C), the imidazole silane (E) comprises a compound represented by the following formula (3), and a content of the imidazole silane (E) is 0.1 to 2.0% by mass based on 100% by mass of the total content of the epoxy compound (A), the cyanate compound (B), and the maleimide compound (C),

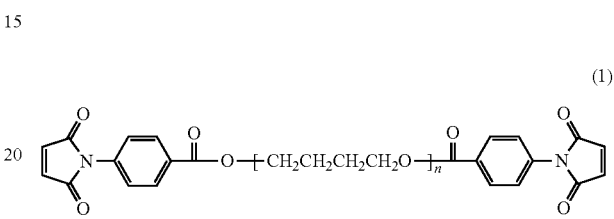

wherein n is a real number in a range of 1 to 30 as an average value,

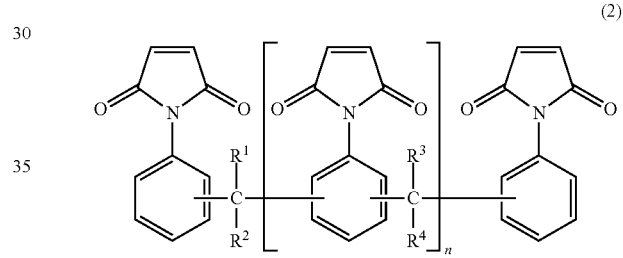

wherein $R^1$, $R^2$, $R^3$, and $R^4$ each independently represent a hydrogen atom or a methyl group, and n is a real number in a range of 1 to 10 as an average value,

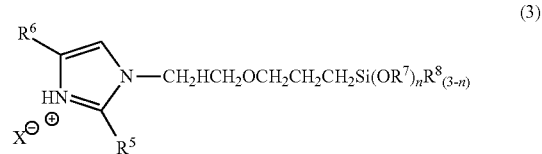

wherein $R^5$ represents hydrogen or an alkyl group having 1 to 20 carbon atoms, $R^6$ represents hydrogen, a vinyl group, or an alkyl group having 1 to 5 carbon atoms, $R^7$ and $R^8$ each independently represent an alkyl group having 1 to 3 carbon atoms, X represents an acetate ion or a phthalate ion, Y represents hydrogen or a hydroxyl group, and n represents an integer of 1 to 3.

2. The resin composition according to claim 1, wherein the cyanate compound (B) comprises a naphthol aralkyl-based cyanate compound represented by the following formula (4) and/or a novolac-based cyanate compound represented by the following formula (5),

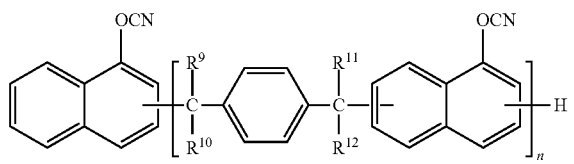

(4)

wherein $R^9$, $R^{10}$, $R^{11}$, and $R^{12}$ each independently represent a hydrogen atom or a methyl group, and n represents an integer of 1 or more,

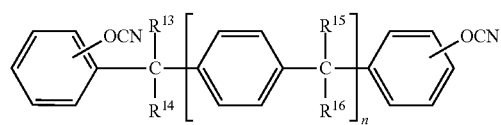

(5)

wherein $R^{13}$, $R^{14}$, $R^{15}$, and $R^{16}$ each independently represent a hydrogen atom or a methyl group, and n represents an integer of 1 or more.

3. The resin composition according to claim 1, wherein the inorganic filler (D) comprises at least one or more selected from the group consisting of silica, aluminum hydroxide, alumina, boehmite, magnesium oxide, and magnesium hydroxide.

4. The resin composition according to claim 1, wherein a content of the epoxy compound (A) is 40 to 75% by mass based on 100% by mass of the total content of the epoxy compound (A), the cyanate compound (B), and the maleimide compound (C).

5. The resin composition according to claim 1, wherein a content of the cyanate compound (B) is 20 to 40% by mass based on 100% by mass of the total content of the epoxy compound (A), the cyanate compound (B), and the maleimide compound (C).

6. The resin composition according to claim 1, wherein a content of the inorganic filler (D) is 50 to 300% by mass based on 100% by mass of the total content of the epoxy compound (A), the cyanate compound (B), and the maleimide compound (C).

7. A prepreg comprising a substrate and the resin composition according to claim 1 with which the substrate is impregnated.

8. A resin sheet comprising an outer layer comprising metal foil or a metal film, and a layer comprising the resin composition according to claim 1 laminated on the outer layer.

9. A metal foil-clad laminate comprising the prepreg according to claim 7 and metal foil laminated on one surface or both surfaces of the prepreg.

10. The metal foil-clad laminate according to claim 9, wherein the metal foil has a matte surface having a surface roughness Rz of 0.70 μm to 2.5 μm.

11. A printed wiring board made using the prepreg according to claim 7 as a buildup material.

12. A printed wiring board made using the resin sheet according to claim 8 as a buildup material.

13. The printed wiring board according to claim 12 made by surface-treating the layer comprising the resin composition in the resin sheet to achieve a roughened surface having an Rz value of 4.0 μm or less, and forming a pattern on the layer comprising the resin composition by plating.

14. A printed wiring board made using the metal foil-clad laminate according to claim 9 as a buildup material.

15. The printed wiring board according to claim 14 made by etching the metal foil of the metal foil-clad laminate, surface-treating a layer comprising the prepreg in the metal foil-clad laminate to achieve a roughened surface having an Rz value of 4.0 μm or less, and forming a pattern on the layer comprising the prepreg by plating.

16. A printed wiring board comprising an insulating layer and a conductor layer formed on a surface of the insulating layer, wherein
the insulating layer comprises the resin composition according to claim 1.

* * * * *